(12) United States Patent
Yoshida et al.

(10) Patent No.: US 7,535,020 B2
(45) Date of Patent: May 19, 2009

(54) SYSTEMS AND METHODS FOR THERMAL SENSING

(75) Inventors: Munehiro Yoshida, Austin, TX (US);
Daniel Stasiak, Austin, TX (US);
Michael F. Wang, Austin, TX (US);
Charles R. Johns, Austin, TX (US);
Hiroki Kihara, Austin, TX (US);
Tetsuji Tamura, Tokyo (JP); Kazuaki Yazawa, Chiba (JP); Iwao Takiguchi, Kanagawa (JP)

(73) Assignees: Kabushiki Kaisha Toshiba, Tokyo (JP);
International Business Machines Corporation, Armonk, NY (US); Sony Computer Entertainment Inc., Tokyo (JP)

( * ) Notice: Subject to any disclaimer, the term of this patent is extended or adjusted under 35 U.S.C. 154(b) by 428 days.

(21) Appl. No.: 11/168,591

(22) Filed: Jun. 28, 2005

(65) Prior Publication Data

US 2006/0289862 A1    Dec. 28, 2006

(51) Int. Cl.
*H01L 23/58* (2006.01)
(52) U.S. Cl. .................. 257/48; 257/467; 257/E29.347; 257/E23.179
(58) Field of Classification Search .................... 257/48, 257/467, E29.347, E23.179
See application file for complete search history.

(56) References Cited

U.S. PATENT DOCUMENTS

| | | |
|---|---|---|
| 6,363,490 B1 | 3/2002 | Senyk |
| 6,535,798 B1 | 3/2003 | Bhatia et al. |
| 6,908,227 B2 * | 6/2005 | Rusu et al. .................. 374/141 |
| 7,427,158 B2 * | 9/2008 | Yoshida ....................... 374/172 |
| 2001/0021217 A1 * | 9/2001 | Gunther et al. ............. 374/178 |
| 2004/0264093 A1 * | 12/2004 | Boerstler et al. ............ 361/103 |

FOREIGN PATENT DOCUMENTS

| | | |
|---|---|---|
| CN | 1153563 A | 7/1997 |
| CN | 1531073 A | 9/2004 |
| JP | 2004-350290 A | 12/2004 |
| WO | WO 2004/019195 A2 | 3/2004 |

* cited by examiner

*Primary Examiner*—Matthew E Warren
(74) *Attorney, Agent, or Firm*—Law Offices of Mark L. Berrier

(57) ABSTRACT

Systems and methods for positioning thermal sensors within an integrated circuit in a manner that provides useful thermal measurements corresponding to different parts of the integrated circuit. In one embodiment, an integrated circuit includes multiple, duplicate functional blocks. A separate thermal sensor is coupled to each of the duplicate functional blocks, preferably in the same relative location on each of the duplicate functional blocks, and preferably at a hotspot. One embodiment also includes thermal sensors on one or more functional blocks of other types in the integrated circuit. One embodiment includes a thermal sensor positioned at a cool spot, such as at the edge of the integrated circuit chip. Each of the thermal sensors may have ports to enable power and ground connections or data connections between the sensors and external components or devices.

11 Claims, 8 Drawing Sheets

SYSTEMS AND METHODS FOR THERMAL SENSING

RELATED APPLICATIONS

This application claims the benefit of U.S. patent application Ser. No. 11/034,644, entitled "Advanced Thermal Sensor," filed on Jan. 13, 2005 by Munehiro Yoshida.

BACKGROUND

1. Field of the Invention

The present invention relates generally to electronic devices, and more particularly to systems and methods for sensing the temperature of devices such as integrated circuits which have multiple, duplicate functional blocks.

2. Related Art

Integrated circuits such as microprocessors are becoming increasingly complex. The circuit components (e.g., transistors, diodes, resistors and the like) that form these devices are, at the same time, becoming increasingly small so that more and more functions may be performed by a particular integrated circuit. As the number of circuit components and functions grows, the amount of power that is typically consumed by these integrated circuits typically also increases. With the increased power consumption of the circuits, the amount of heat generated within the circuits increases as well. This heat may affect the performance of the devices, and may even cause the devices to fail.

As a result of the dangers presented by the generation of increased amounts of heat in electronic devices, it is often necessary to be able to detect temperatures within these devices. Thermal sensing circuits are therefore incorporated into some devices in order to detect dangerously high temperatures or even measure temperatures within the devices. For example, a thermal sensing circuit can be incorporated into an integrated circuit in order to sense the temperature of the circuit and determine whether the temperature exceeds a predetermined threshold. If the temperature exceeds this threshold, corrective action (e.g., reducing the activity within the circuit or even shutting down the circuit) can be taken in order to reduce the temperature to a safer level.

Conventionally, thermal sensors include an on-chip component, such as a thermally sensitive diode, and an off-chip component that includes circuitry configured to receive a measurement of some characteristic associated with the on-chip, and to generate a temperature measurement based on this measurement. In the case of the on-chip diode, the voltage drop across the diode is determined, and the temperature measurement is computed based upon this voltage drop.

There are several problems with this conventional approach for measuring the temperature of an integrated circuit. One of the problems relates to the positioning of the thermally sensitive on-chip component of the sensor in order to obtain the best temperature measurement. Because there are typically hotspots within an integrated circuit, the temperature that is measured by the thermal sensor will vary with the location of the on-chip component. If this component is placed near a hotspot, the measured temperature will be higher, and if it is placed near a less active portion of the chip, the measured temperature will be lower. The location of the on-chip component can therefore affect the actions that may be taken in response to certain temperature conditions. For example, if control circuitry is configured to shut down the integrated circuit when a temperature threshold is exceeded, the integrated circuit may be shut down sooner or later, depending upon the placement of the on-chip component.

The positioning of the on-chip component of the thermal sensor is addressed in some integrated circuits by using several different thermal sensors. The on-chip component of each thermal sensor can then be placed at a different location within the integrated circuit. The thermal sensors are placed without regard to hot spots or cool spots. The positioning of the sensors with respect to the hot spots and cool spots is essentially random. Some of the thermal sensors may therefore measure temperatures at locations which are closer to hotspots, while others may measure temperatures at locations which are more distant from hotspots. Control circuitry coupled to an integrated circuit with multiple sensors may be configured to respond, for instance, to an average of all of the sensed temperatures, or to the highest of the sensed temperatures. In either case, the control circuitry is typically configured to respond to the measured temperatures as a single stimulus, to which a single response (e.g. shutting down the entire chip) is provided. Thus, if a hotspot temperature measurement exceeds a predetermined threshold, the entire chip may be shut down. Conversely, if the temperature measurements are averaged, the chip may not be shut down, even though one of the sensors indicates that a safe temperature threshold has been exceeded.

It would therefore be desirable to provide systems and methods for positioning thermal sensors with respect to an electronic device so that the resulting temperature information is useful as separate [data points] that can be used by the control circuitry to more efficiently and effectively control the operation of the device.

SUMMARY OF THE INVENTION

One or more of the problems outlined above may be solved by the various embodiments of the invention. Broadly speaking, the invention includes systems and methods for positioning thermal sensors within an integrated circuit in a manner that provides useful thermal measurements corresponding to different parts of the integrated circuit. This may enable control circuitry to efficiently control operation of the different parts of the integrated circuit based upon the distinct temperature measurements.

In one embodiment, a thermal sensing system is implemented in an integrated circuit having multiple, duplicate functional blocks. Each of the duplicate functional blocks has a corresponding thermal sensor coupled to it so that the temperature of each duplicate functional block can be separately monitored. The thermal sensors are preferably positioned in the same relative location on each of the duplicate functional blocks, and this position is also preferably a hotspot of each duplicate functional block. In addition to the thermal sensors on each of the duplicate functional blocks, there may be one or more thermal sensors on functional blocks of other types in the integrated circuit. Still further, there may be a thermal sensor positioned at a cool spot on the integrated circuit, such as at the edge of the integrated circuit chip. Each of the thermal sensors in the integrated circuit may be constructed on the integrated circuit chip instead of having only a thermally sensitive component such as a diode on the chip and the remainder of the sensor components off the chip. Each of the thermal sensors may have ports to enable electrical communication between the sensors and external components or devices. The ports may, for example, be used to provide power and ground connections to the thermal sensors that are free from the switching noise that is present in the integrated circuit. The ports may also be used to communicate thermal indicator signals to components or devices external to the integrated circuit chip. Control circuitry may be coupled to the thermal sensors to enable the functional blocks of the integrated circuit to be separately controlled, based on the sensed temperatures corresponding to the respective functional blocks.

An alternative embodiment comprises a method including separately sensing the temperatures of a set of duplicate functional blocks in an integrated circuit. In one embodiment, the method includes independently adjusting operation of each of the duplicate functional blocks based on a corresponding sensed temperature. In one embodiment, the temperature of each duplicate functional block is sensed at the same location on each duplicate functional block. In one embodiment, this location comprises a hotspot on the duplicate functional block. The method may also include separately sensing temperatures of one or more additional functional blocks in the integrated circuit. Further, the method may include separately sensing a temperature of a cool spot in an integrated circuit.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
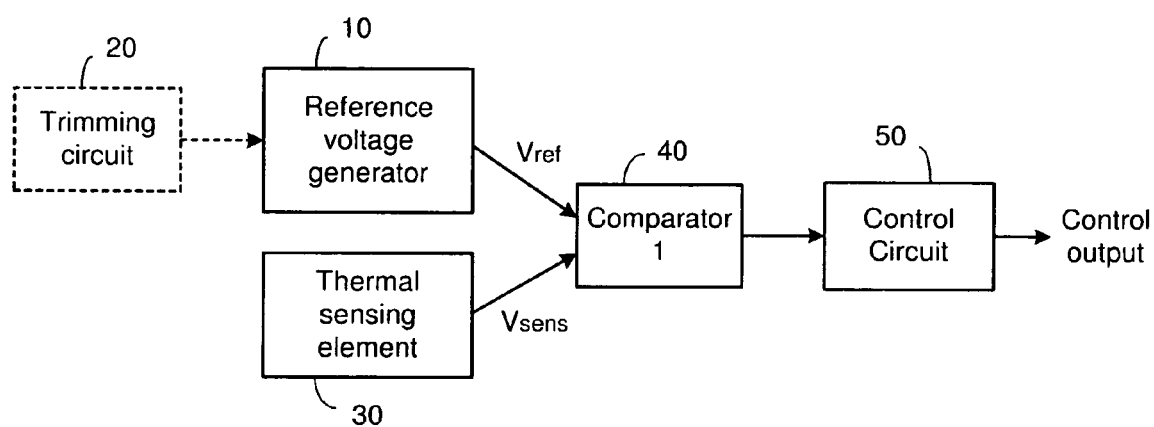
FIG. 1 is a block diagram illustrating the structure of one type of thermal sensing circuit.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for positioning thermal sensors within an integrated circuit in a manner that provides useful thermal measurements corresponding to different functional blocks of the integrated circuit. This may enable control circuitry to efficiently control operation of the different parts of the integrated circuit based upon the distinct temperature measurements.

In one embodiment, a thermal sensing system is implemented in an integrated circuit having multiple, duplicate functional blocks. These duplicate functional blocks may, for instance, be processor cores in a multiprocessor integrated circuit chip. While each of the duplicate functional blocks performs essentially the same function, the different blocks typically do not perform the exact same operations. In the case of the multiprocessor chip, each of the processor cores may execute a different thread, process different data, access different memory locations, and so on. Consequently, the different functional blocks often use different amounts of power and dissipate different amounts of heat. Some of the functional blocks may therefore reach dangerously high temperatures while others do not. Accordingly, it may be necessary to restrict the operation of some of the functional blocks, but not others.

Because the duplicate functional blocks may perform different operations and reach different temperatures, it is useful to monitor the temperatures of the functional blocks separately. The present system therefore incorporates a set of thermal sensors, each of which is positioned on one of the duplicate functional blocks. In order to obtain comparable thermal measurements of comparable activity in each duplicate functional block, the thermal sensors are located at the same position on each duplicate functional block. In this embodiment, each thermal sensor is positioned at a hotspot on the corresponding duplicate functional block.

In addition to the duplicate functional blocks, there are other types of functional blocks in the integrated circuit. One embodiment therefore includes thermal sensors that are positioned on one or more of these additional functional blocks. Another thermal sensor may also be provided to sense the temperature of a cool spot on the integrated circuit. This thermal sensor may, for example, be positioned at the edge of the integrated circuit chip.

Each of the thermal sensors in the integrated circuit may be an entire sensor. That is, all of the sensor components may be constructed on the integrated circuit chip instead of having only a thermally sensitive component such as a diode on the chip and the remainder of the sensor components off the chip. The thermal sensors may include ports to enable electrical communication between the sensors and external components or devices. These ports may be used to provide noise-free power and ground connections to the thermal sensors, or they may be used to communicate thermal indicator signals to components or devices external to the integrated circuit chip. Control circuitry may be coupled to the thermal sensors to enable the functional blocks of the integrated circuit to be separately controlled, based on the sensed temperatures corresponding to the respective functional blocks.

Before discussing the various embodiments of the invention in detail, it will be helpful to briefly discuss thermal sensors of the type that might be used in the various embodiments of the invention. Referring to FIG. 1, a block diagram illustrating the structure of one type of thermal sensing circuit is shown. In this figure, a reference voltage generator 10 generates a reference voltage. Although most conventional thermal sensors use a reference voltage that is constant over the range of possible temperatures, other thermal sensors, such as those disclosed in related U.S. patent application Ser. No. 11/034,644 use a reference voltage that varies with temperature. In conventional thermal sensors, a trimming circuit 20 is typically coupled to reference voltage generator 10 in order to allow the value of the constant reference voltage to be adjusted to compensate for manufacturing variations in the circuits.

A thermal sensing element 30 generates a voltage that varies with the temperature of the sensing element. The sensing element may, for example, be a diode. The voltage generated by thermal sensing element 30 decreases as the temperature of the sensing element increases. The reference voltage generated by reference voltage generator 10 and the voltage generated by thermal sensing element 30 are both provided to comparator 40. Comparator 40 is configured to determine whether the voltage provided by thermal sensing element 30 is higher or lower than the reference voltage provided by reference voltage generator 10.

Comparator 40 generates a binary output signal that is asserted (or not) depending upon the relationship between the two received voltages. Typically, comparator 40 will be configured to generate a signal that is high when the voltage generated by thermal sensing element 30 is lower than the reference voltage of reference voltage generator 40 (i.e., the sensed temperature is higher than the temperature corresponding to the reference voltage.) The signal generated by comparator 40 is then provided to control circuit 50, which is configured to take corrective action if the signal from comparator 40 is asserted. For example, if the sensed temperature is above the reference temperature and the signal is asserted, control circuit 50 may reduce the operating speed or shut down the circuit in which the thermal sensing system is implemented.

Figure 2:
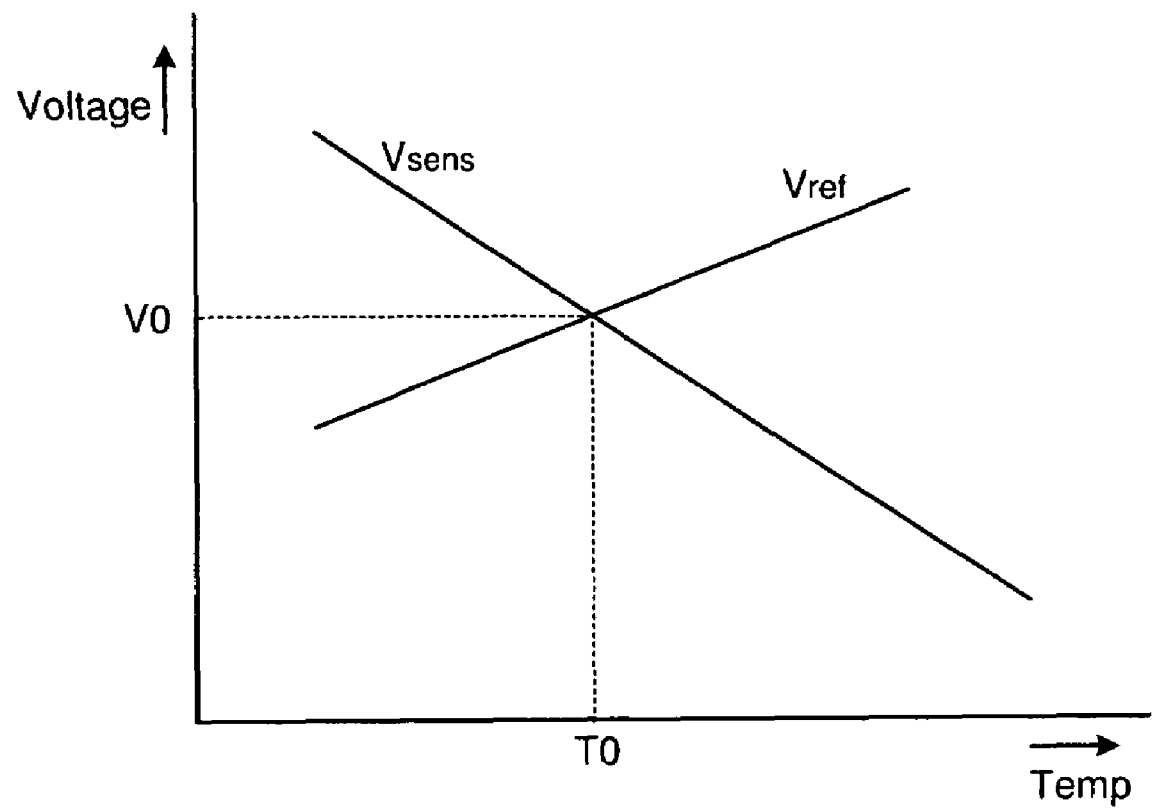
FIG. 2 is a diagram illustrating the relationship between the reference voltage and the temperature-dependent voltage produced by the reference voltage generator and thermal sensing element in the system of FIG. 1.

Referring to FIG. 2, a diagram illustrating the relationship between the reference voltage produced by reference voltage generator 10 and the temperature-dependent voltage produced by thermal sensing element 30 in the system of FIG. 1 is shown. FIG. 2 is a graph of voltage (on the vertical axis) versus temperature (on the horizontal axis.) It can be seen that the reference voltage in this figure is not constant, but instead increases with temperature. The voltage produced by thermal sensing element 30, the other hand, decreases as the temperature increases. It can be seen that these two voltage curves cross at a reference temperature, $T_0$.

As noted above, the reference voltage generator may alternatively be configured to produce a constant voltage. The reference voltage generator may even be configured to produce a voltage that decreases as temperature increases, as long as the slope of the reference voltage curve is greater than the slope of the sensor voltage curve. The embodiments discussed in detail herein will use a reference voltage generator that produces a voltage having a positive temperature coefficient because the voltage different between this reference and the sensor voltage is greater than when a reference voltage that is constant or decreasing (with temperature) is used.

Figure 3:
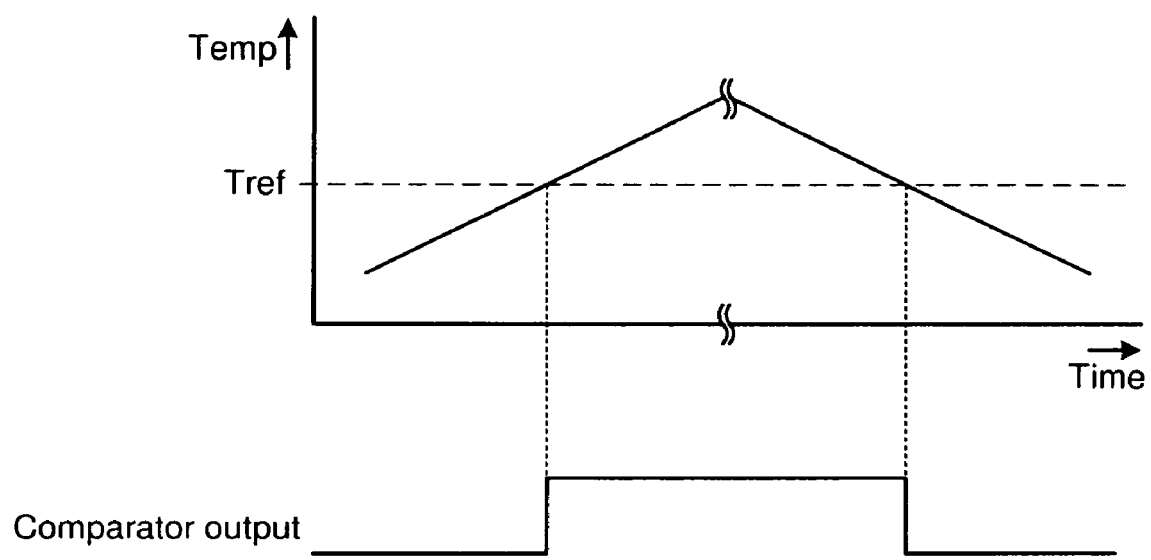
FIG. 3 is a diagram illustrating the output signal generated by a comparator as a function of the relationship between sensed and reference temperatures in one embodiment.

Referring to FIG. 3, a diagram illustrating an output signal generated by comparator 40 as a function of the relationship between the sensed and reference temperatures is shown. At the top of FIG. 3 is a graph of the sensed temperature (Ts) as a function of time. The constant reference temperature ($T_0$) is also indicated on the figure. At the bottom of the figure is the comparator output signal as a function of time. On the left side of FIG. 3, the sensed temperature is initially below the reference temperature. The binary output signal is therefore low. The sensed temperature gradually increases until, at time t1, the sensed temperature is equal to the reference temperature. The sensed temperature continues to increase so that it is greater than the reference temperature at time t1+Δt. When the sensed temperature becomes greater than the reference temperature, the binary output signal goes high. Later, the sensed temperature decreases, becoming less than the reference temperature at time t2. When the sensed temperature becomes less than the reference temperature, the binary output signal again goes low.

In one embodiment, a thermal sensor as described above is compact enough that the entire sensor, including the thermal sensing element and the reference voltage generator, can be efficiently constructed on an integrated circuit (As compared to conventional implementations, in which the thermal sensing element is integral to the integrated circuit and the circuitry for comparing the voltages and generating an output signal are off the chip.) An exemplary structure for such a thermal sensor will be described in detail below. On-chip thermal sensors such as this may provide a variety of advantages, including faster response times (smaller time constants,) smaller sizes, less complex (if any) chip interfaces, and so on.

Figure 4:
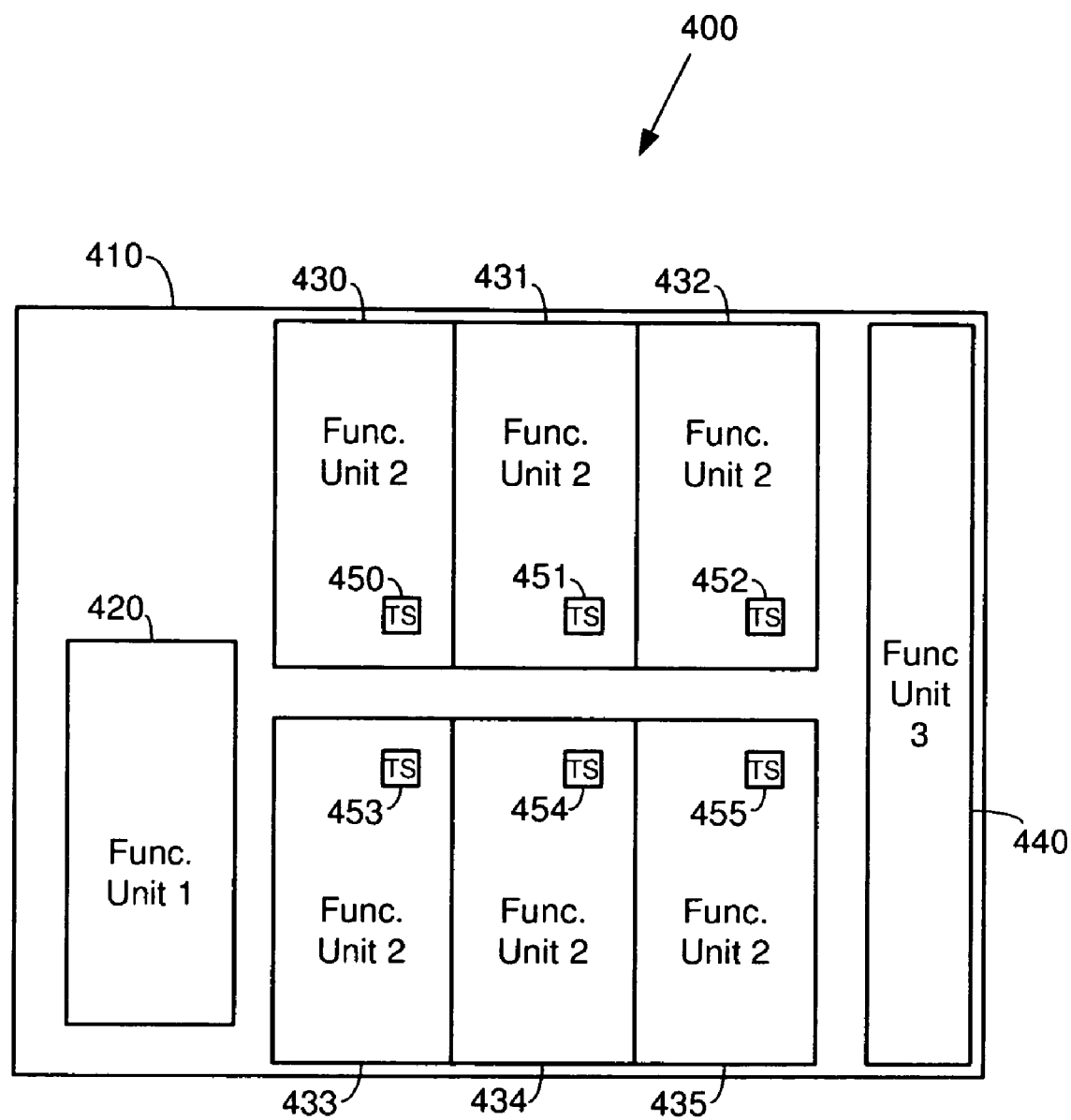
FIG. 4 is a diagram illustrating an integrated circuit that makes use of small, on-chip thermal sensors to monitor the temperatures of a set of duplicate functional blocks in accordance with one embodiment.

Referring to FIG. 4, a diagram illustrating an integrated circuit that makes use of these small, on-chip thermal sensors to monitor the temperatures of a set of duplicate functional blocks in accordance with one embodiment is shown.

In the embodiment of FIG. 4, an integrated circuit chip 400 includes multiple functional blocks. "Functional block," as used here, refers to a block of logic and/or circuitry on the integrated circuit that serves a particular function. For example, as shown in the figure, integrated circuit chip 400 includes nine functional blocks, 410, 420, 430-435 and 440. (Although not depicted as a rectangular block like the other functional blocks in the figure, functional block 410 includes logic and/or circuitry that serves a separate function in the integrated circuit.) Functional blocks 430-435 of integrated circuit 400 are duplicates of each other.

It should be noted that "duplicate," as used herein, is intended to include functional blocks that may not be identical in every physical detail or in configuration. For example, functional blocks 430-432 may be mirror images of functional blocks 433-435. As another example, if functional blocks 430-435 are data processing units, one of these units may be configured as a master, while the others are configured as slaves. There may be other minor differences as well.

Integrated circuit 400 is representative of a multiprocessor, where each of functional blocks 430-435 is a separate processor core. Functional blocks 410, 420 and 440 provide functions that are used in support of the processing functions of processor cores 430-435, such as data storage (memory,) input/output (I/O,) and the like.

In addition to the functional blocks, integrated circuit 400 includes a set of thermal sensors, 450-455. Each of thermal sensors is coupled to a corresponding one of processor cores 430-435. This enables the independent sensing of temperatures corresponding to each of the different processor cores. This can be important because, even though the processor cores are duplicates of each other, different tasks will be performed by each of the processor cores. Consequently, the different processor cores will experience different levels of loading (number of operations performed) and will dissipate different amounts of heat. Some of the processor cores may therefore reach threshold temperatures while others do not. Since the temperatures of the processor cores are separately sensed, it may be possible to control the operation of selected ones of the processor cores to reduce their temperatures, while the other processor cores remain unaffected. Other functional blocks can also be controlled based upon temperatures sensed by corresponding dedicated thermal sensors.

It should be noted that the placement of a separate thermal sensor on each of the duplicate blocks (in this case, processor cores) is in contrast to conventional thermal sensing systems, in which a single temperature representative of the entire integrated circuit is sensed and used to control the operation of the entire integrated circuit. Even when multiple thermal sensors are used in conventional systems, these sensors are normally used to determine a single condition (e.g., whether any of the sensors detects a temperature above a predetermined threshold) which causes action to be taken with respect to the entire integrated circuit (e.g., shutting down the integrated circuit.) Still further, conventional multi-sensor systems do not position thermal sensors on each of multiple duplicate functional blocks, perhaps because it is conventionally assumed that duplicate functional blocks perform roughly the same operations and would experience roughly the same temperatures.

Referring again to FIG. 4, it can be seen that, in this embodiment, each of thermal sensors 450-452 is positioned in the same location with respect to the corresponding one of functional blocks 430-432. Similarly, each of thermal sensors 453-455 is positioned in the same location with respect to the corresponding one of functional blocks 433-435. It is assumed for the purposes of this disclosure that functional blocks 433-435 are mirror images of functional blocks 430-432. Consequently, each of thermal sensors 450-455 is considered to be positioned in the same location with respect to the corresponding one of functional blocks 430-435 (i.e., at the location of the same functional components within the corresponding functional block.)

In one embodiment, each of thermal sensors 450-455 is positioned at a hotspot on the corresponding one of functional blocks 430-435. In many instances, the physical layout of an integrated circuit will have one or more areas that include a higher concentration of components that experience a high level of activity during normal operation. Because there is a high level of activity in these areas, the amount of power used by the circuit components in these areas is higher and a greater amount of heat is dissipated in these areas than in other areas of the integrated circuit. Because of the higher levels of activity and greater power dissipation in these areas, they are often referred to as "hotspots."

Figure 5:
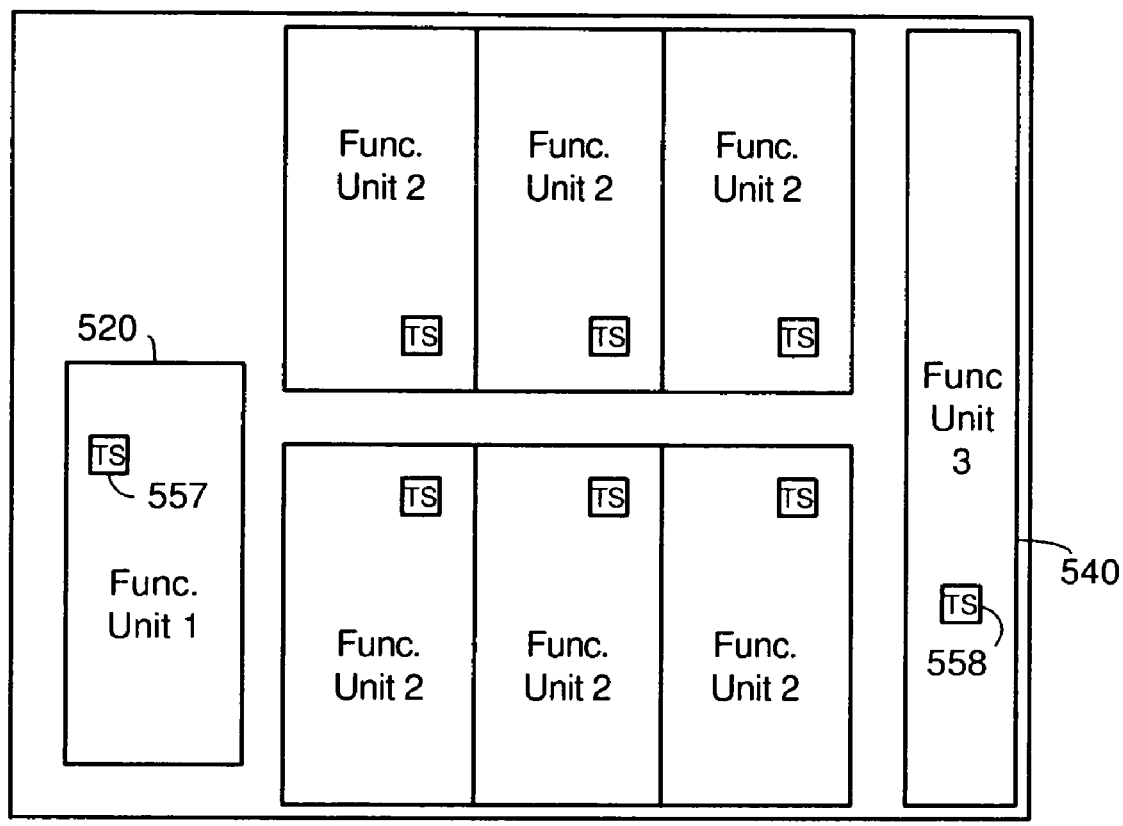
FIG. 5 is a functional block diagram illustrating an integrated circuit in accordance with an alternative embodiment.

Referring to FIG. 5, a functional block diagram illustrating an integrated circuit in accordance with an alternative embodiment is shown. In this figure, there is again a thermal sensor positioned on each of the duplicate functional blocks as in FIG. 4. Additionally, there are thermal sensors positioned on one or more of the other functional blocks in the integrated circuit. In this instance, thermal sensor 557 is positioned on functional block 520, and thermal sensor 558 is positioned on functional block 540. In one embodiment, each of these thermal sensors is positioned at a hotspot of the corresponding one of the functional blocks.

Figure 6:
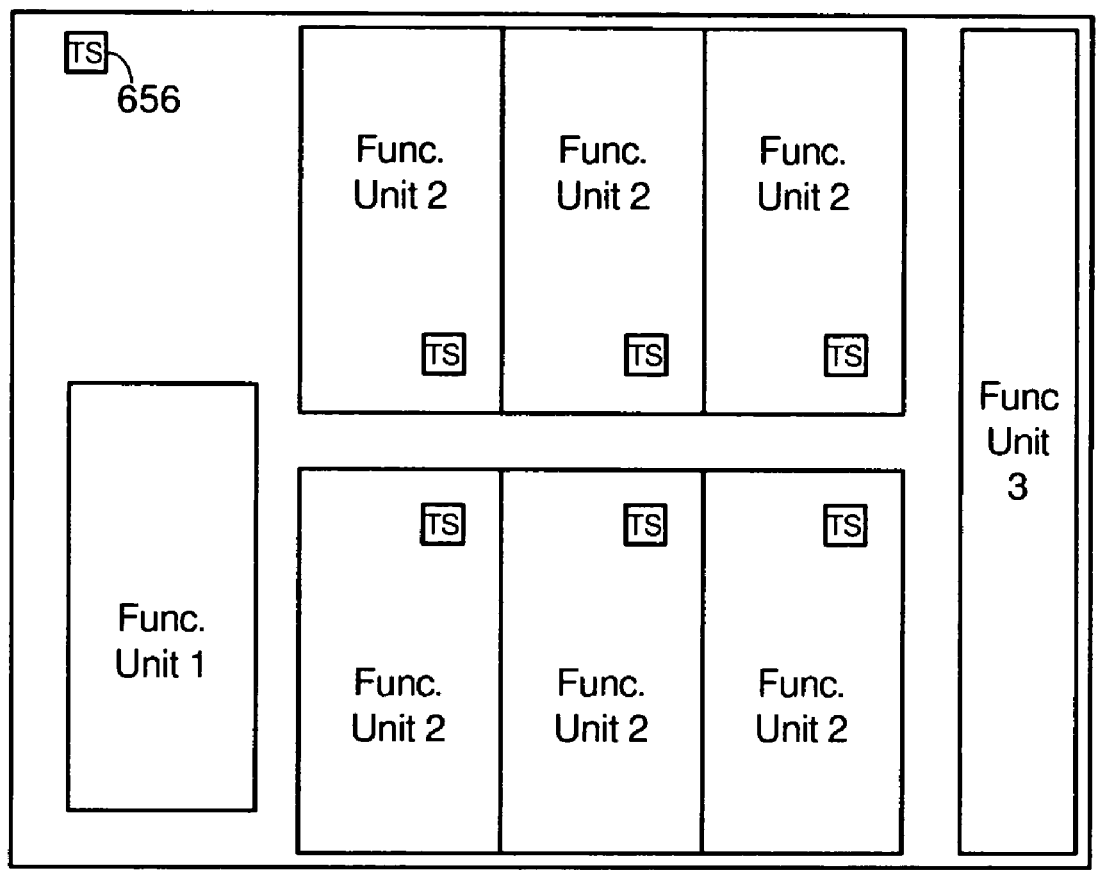
FIG. 6 is a functional block diagram illustrating an integrated circuit in accordance with another alternative embodiment.

Referring to FIG. 6, a functional block diagram illustrating an integrated circuit in accordance with another alternative embodiment is shown. In this figure, there are a plurality of duplicate functional blocks, each of which has a corresponding thermal sensor. Additionally, there is a thermal sensor 656 which is positioned at a cool spot on the integrated circuit.

The "cool spot" is a location where there is little or no activity in the integrated circuit, so very little heat is dissipated in this area, causing it to remain cooler than other areas of the integrated circuit. The cool spot may be a location where the integrated circuit has no functional components, or there may be functional components that experience relatively little activity and generate less heat than other areas of the integrated circuit (e.g., memory cells.) In one embodiment, the sensor is positioned near the edge of the integrated circuit.

It may be useful to position a thermal sensor in a cool spot on the integrated circuit in order to obtain information regarding, for example, temperature gradients across the integrated circuit chip. Because the characteristics of some circuit components may change with temperature, temperature gradients across the integrated circuit may cause variations in timing or other changes that may affect the performance of the integrated circuit. Cool spot temperature measurements may also be useful in determining minimum or ambient temperatures for the chip that can provide the basis for controlling chip-level (as opposed to functional-block-level) actions.

Figure 7:
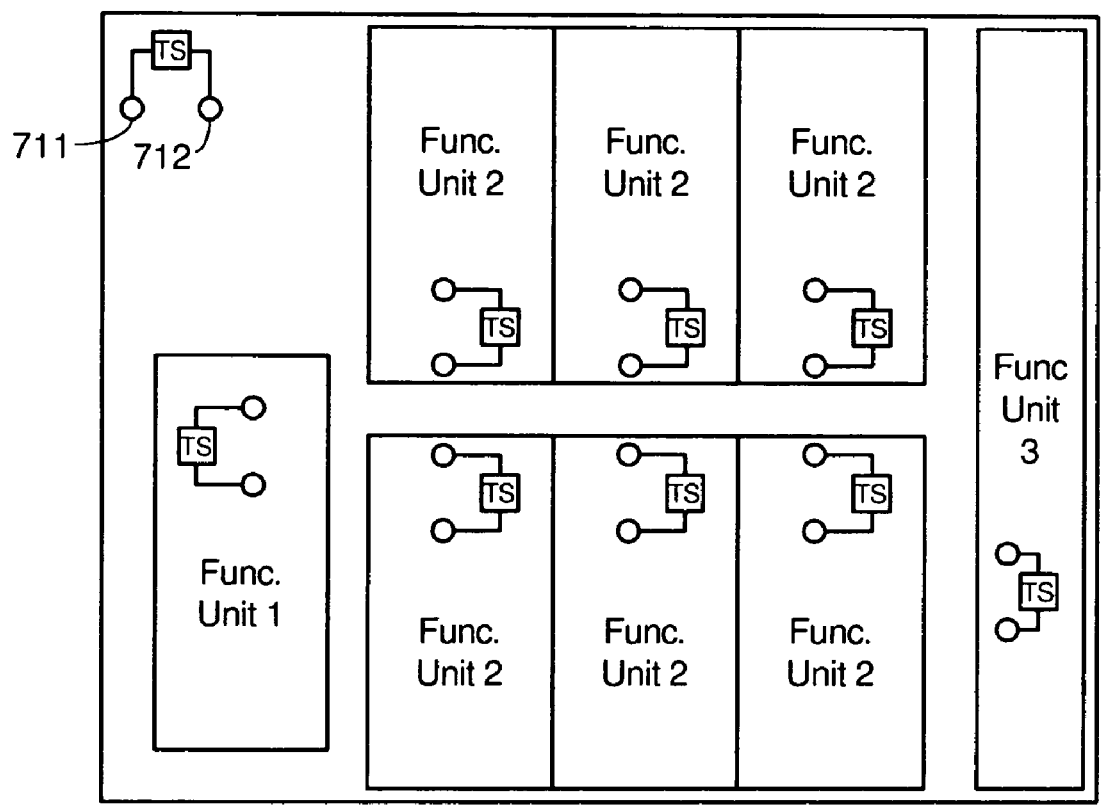
FIG. 7 is a functional block diagram illustrating an integrated circuit in accordance with another alternative embodiment.

Referring to FIG. 7, a functional block diagram illustrating an integrated circuit in accordance with another alternative embodiment is shown. In this figure, each of the thermal sensors is coupled to a pair of ports (e.g., 711 and 712) to allow electrical signals to be communicated between the sensors and some external (off-chip) component, such as a power supply, test equipment, or the like. These ports may simply be external pins on the integrated circuit package.

In one embodiment, the ports are used to provide power and ground connections to the thermal sensors. Because the on-chip power sources are used by the many switching components in the integrated circuit, the voltages that are provided by these sources may be subject to a great deal of switching noise, which may affect the temperature sensing capabilities of the sensors. The ports may be used to allow the thermal sensors to make external power and ground connections which are free from switching noise. The availability of external power may also enable operation of the thermal sensors when the integrated circuit is powered down, thereby facilitating calibration of the sensors.

In another embodiment, the ports are used to enable external access to signals generated by the thermal sensors. For example, a binary signal indicating whether or not the temperature sensed by a thermal sensor has exceeded a threshold temperature may be provided to external components via these ports. These signals may be useful in the operation of external test equipment or other components of a system in which the integrated circuit is implemented.

In an alternative embodiment, a set of ports may be coupled to more than a single one of the thermal sensors. This may be particularly useful in the situation in which the ports are used to allow connections of the sensors to external power and ground. Because the thermal sensors do not have to be independently connected to power and ground, two or more of the sensors may have internal lines connecting their respective power and ground inputs, and then these lines can be connected through the ports to external power and ground.

As noted above, the thermal sensors that are coupled to each of the functional blocks are, in one embodiment, entirely embedded in the integrated circuit. That is, both the thermally sensitive component and the other components of the sensor (e.g., reference voltage generator) are constructed on the chip. An exemplary thermal sensor is described below in connection with FIG. 8. This type of sensor can react to changes in sensed temperatures more quickly than more conventional sensors in which the thermally sensitive component (e.g. a diode) is located on the chip and the remainder of the sensor is located off the chip. Conventional thermal sensors can nevertheless be used in alternative embodiments. In fact, in some instances, it may be desirable to use a sensor that has a slower response time in order to minimize the variations in the measured temperature.

Figure 8:
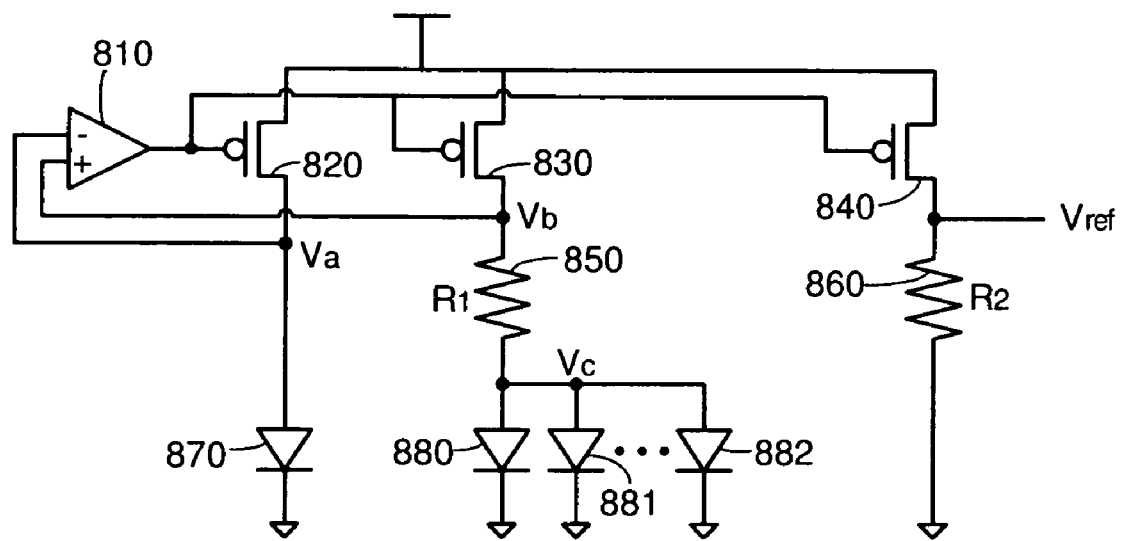
FIG. 8 is a diagram illustrating the structure of a combined thermal sensing element and reference voltage generator suitable for on-chip implementation in accordance with one embodiment.

Referring to FIG. 8, a diagram illustrating the structure of a combined thermal sensing element and reference voltage generator suitable for on-chip implementation in accordance with one embodiment is shown. This circuit 800 consists of an operational amplifier 810, three PMOS transistors (820, 830, 840,) two resistors (850, 860) and multiple diodes (870, 880-882.) It should be noted that, although only three diodes are explicitly shown in FIG. 8, the series of diodes 880-882 may include N diodes, where N is typically greater than or equal to 2.

The source of transistor 820 is coupled to the power supply voltage (Vdd.) The drain of transistor 820 is coupled to the anode of diode 870. The cathode of diode 870 is coupled to ground. The source of transistor 830 is also coupled to the power supply voltage, but the drain of this transistor is coupled to one end of resistor 850. The other end of resistor 850 is coupled to the anodes of each of diodes 880-882. The cathodes of each of diodes 880-882 are coupled to ground. The source of transistor 840 is also coupled to the power supply voltage. The drain of transistor 840 is coupled to one end of resistor 860. The other end of resistor 860 is coupled to ground.

The gates of each of transistors 820, 830 and 840 are coupled to the output of operational amplifier 810. If each of transistors 820, 830 and 840 is identical, the same amount of current flows through each of these transistors. The inputs of operational amplifier 810 are coupled to the drains of transistors 820 and 830. The voltage ($V_a$) at the drain of transistor 820 is the potential across the PN junction of diode 870. The voltage ($V_b$) at the drain of transistor 830 is this some of the potentials across resistor 850 and the PN junctions of diodes 880-882 (which are effectively the same as a single PN junction with greater cross-sectional area than diode 870.)

The characteristic behavior of a diode can be expressed as $I \sim I_s \exp(qV_{be}/kT)$. If the current through diode 870 can be set equal to the sum of the currents through diodes 880-882, then:

$$I_s \exp(qV_d/kT) = N * I_s \exp(qV_c/kT)$$

where $V_c$ is the voltage at the node between resistor 850 and diodes 880-882, and N is the number of diodes 880-882. Then, the voltage across resistor 850 can be expressed as:

$$\Delta V_f = V_a - V_c = \ln N * kT/q$$

Then, since the current through transistor 830 is the same as the current through transistor 840, the reference voltage can be expressed as:

$$V_{ref} = \Delta V_f * R_2 / R_1$$

where $R_1$ is the value of resistor 850, and $R_2$ is the value of resistor 860. The reference voltage can therefore be set to a desired value by the appropriate choice of $R_1$ and $R_2$.

In the circuit of FIG. 8, the first transistor (820) and the first diode (870) serve as the thermal sensor shown FIG. 1. Transistor 820 serves to provide a constant current through diode 870. The voltage at the drain of transistor 820 ($V_a$) is used as the sensor voltage, $V_{sens}$. The across the diode (870) has negative temperature-coefficient of approximately −1.5 mV/K.

Circuit 800 produces a single reference voltage that, when compared with the sensor voltage (which has negative temperature-coefficient) generated by thermal sensing element, results in a single binary output that indicates whether the sensor temperature is above or below a reference temperature. Other circuit structures can be used to provide multiple reference voltages, so that the sensed temperature can be compared with these multiple reference temperatures. Exemplary structures are identified in U.S. patent application Ser. No. 11/034,644.

Those of skill in the art will understand that information and signals may be represented using any of a variety of different technologies and techniques. For example, data, instructions, commands, information, signals, bits and symbols that may be referenced throughout the above description may be represented by voltages, currents, electromagnetic waves, magnetic fields or particles or any combination thereof.

The various illustrative logical blocks, modules, and circuits described in connection with the embodiments disclosed herein may be implemented or performed with various types of devices, including general purpose processors, digital signal processors (DSPs), application specific integrated circuits (ASICs), field programmable gate arrays (FPGAs) or other programmable logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising:
    an integrated circuit having a plurality of duplicate processor cores;
    a first set of thermal sensors, wherein each of the first set of thermal sensors is coupled to a corresponding one of the duplicate processor cores and positioned at the same location on the corresponding one of the duplicate processor cores;
    control circuitry coupled to each of the thermal sensors in the first set, wherein the control circuitry is configured to independently adjust operation of each of the processor cores based on a corresponding temperature signal received from the thermal sensor coupled to the processor core; and
    an additional thermal sensor that is positioned at a cool spot of the integrated circuit.

2. The system of claim 1, wherein the additional thermal sensor is positioned at an edge of the integrated circuit.

3. The system of claim 1, further comprising
    one or more ports coupled to the thermal sensors, wherein the ports enable electrical signals to be communicated directly between the thermal sensors and one or more off-chip electrical components.

4. The system of claim 3, wherein each port is coupled to no more than two of the thermal sensors.

5. The system of claim 4, wherein each port is coupled to only one of the thermal sensors.

6. The system of claim 3, wherein each port is coupled to one or more power and ground lines in the corresponding thermal sensors and configured to enable the coupling of the power and ground lines to external power and ground connections.

7. The system of claim 3, wherein each port is coupled to one or more input/output lines in the corresponding thermal sensors and configured to enable the coupling of the input/output lines to external signal lines.

8. A system comprising:
    an integrated circuit having a plurality of duplicate processor cores, wherein each of the duplicate processor cores is functionally identical to the other duplicate processor cores;
    a first set of thermal sensors, wherein each of the first set of thermal sensors is coupled to a corresponding one of the duplicate processor cores and positioned at the same location on the corresponding one of the duplicate processor cores;
    control circuitry coupled to each of the thermal sensors in the first set, wherein the control circuitry is configured to independently adjust operation of each of the processor cores based on a corresponding temperature signal received from the thermal sensor coupled to the processor core; and
    an additional thermal sensor that is positioned at a cool spot of the integrated circuit.

9. The system of claim 8, wherein each of the first set of thermal sensors is positioned at a hotspot of the corresponding one of the duplicate processor cores.

10. The system of claim 8, further comprising one or more additional functional blocks of types that are different from the duplicate processor cores and a second set of thermal sensors, wherein each of the second set of thermal sensors is coupled to a corresponding one of the additional functional blocks.

11. The system of claim 8, wherein each of the first set of thermal sensors is implemented entirely on the integrated circuit.

* * * * *